(12) United States Patent
Liang et al.

(10) Patent No.: US 10,163,774 B2
(45) Date of Patent: Dec. 25, 2018

(54) PROTRUSION BUMP PADS FOR BOND-ON-TRACE PROCESSING

(71) Applicant: Taiwan Semiconductor Manufacturing Company, Ltd., Hsin-Chu (TW)

(72) Inventors: Yu-Min Liang, Zhongli (TW); Jiun Yi Wu, Zhongli (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 15/003,632

(22) Filed: Jan. 21, 2016

(65) Prior Publication Data
US 2016/0155697 A1 Jun. 2, 2016

Related U.S. Application Data

(62) Division of application No. 14/148,482, filed on Jan. 6, 2014, now Pat. No. 9,275,967.

(51) Int. Cl.
*H01L 21/66* (2006.01)
*H01L 23/00* (2006.01)
(Continued)

(52) U.S. Cl.
CPC ........ *H01L 23/49838* (2013.01); *H01L 22/14* (2013.01); *H01L 23/481* (2013.01); *H01L 23/49822* (2013.01); *H01L 23/49894* (2013.01); *H01L 24/11* (2013.01); *H01L 24/17* (2013.01); *H01L 24/81* (2013.01); *H05K 1/0268* (2013.01); *H05K 1/113* (2013.01); *H05K 3/4007* (2013.01); *H01L 23/49811* (2013.01); *H01L 23/49827* (2013.01); *H01L 24/02* (2013.01); *H01L 24/13* (2013.01); *H01L 24/16* (2013.01);
(Continued)

(58) Field of Classification Search
CPC ......... H01L 23/49816; H01L 23/49838; H01L 23/485; H01L 24/04; H01L 24/06
See application file for complete search history.

(56) References Cited

U.S. PATENT DOCUMENTS 5,763,936 A * 6/1998 Yamaha ............... H01L 23/3171
257/620
5,892,277 A * 4/1999 Ikemizu ............ H01L 23/49572
257/700

(Continued)

FOREIGN PATENT DOCUMENTS

CN 102054811 5/2011
CN 102111952 A 6/2011
(Continued)

*Primary Examiner* — David A Zarneke
(74) *Attorney, Agent, or Firm* — Slater Matsil, LLP

(57) ABSTRACT

A die and a substrate are provided. The die comprises at least one integrated circuit chip, and the substrate comprises first and second subsets of conductive pillars extending at least partially therethrough. Each of the first subset of conductive pillars comprises a protrusion bump pad protruding from a surface of the substrate, and the second subset of conductive pillars each partially form a trace recessed within the surface of the substrate. The die is coupled to the substrate via a plurality of conductive bumps each extending between one of the protrusion bump pads and the die.

20 Claims, 5 Drawing Sheets

(51) Int. Cl.
  *H01L 23/48*    (2006.01)
  *H01L 23/498*   (2006.01)
  *H05K 1/02*     (2006.01)
  *H05K 1/11*     (2006.01)
  *H05K 3/40*     (2006.01)
  *H05K 3/46*     (2006.01)

(52) U.S. Cl.
  CPC ............... *H01L 2224/0401* (2013.01); *H01L 2224/11614* (2013.01); *H01L 2224/11622* (2013.01); *H01L 2224/131* (2013.01); *H01L 2224/133* (2013.01); *H01L 2224/13144* (2013.01); *H01L 2224/13294* (2013.01); *H01L 2224/16225* (2013.01); *H01L 2224/16227* (2013.01); *H01L 2224/16235* (2013.01); *H01L 2224/16238* (2013.01); *H01L 2224/1712* (2013.01); *H01L 2224/17132* (2013.01); *H01L 2224/81424* (2013.01); *H01L 2224/81444* (2013.01); *H01L 2224/81447* (2013.01); *H01L 2224/81455* (2013.01); *H01L 2224/81466* (2013.01); *H01L 2224/81815* (2013.01); *H01L 2924/01057* (2013.01); *H01L 2924/01072* (2013.01); *H01L 2924/0533* (2013.01); *H01L 2924/0534* (2013.01); *H01L 2924/05042* (2013.01); *H01L 2924/05342* (2013.01); *H01L 2924/05432* (2013.01); *H01L 2924/05442* (2013.01); *H01L 2924/05994* (2013.01); *H01L 2924/14* (2013.01); *H01L 2924/1531* (2013.01); *H01L 2924/15787* (2013.01); *H01L 2924/2064* (2013.01); *H01L 2924/20641* (2013.01); *H05K 3/4682* (2013.01); *H05K 2201/0367* (2013.01); *H05K 2201/096* (2013.01); *H05K 2201/0989* (2013.01); *H05K 2201/10674* (2013.01); *H05K 2203/0353* (2013.01)

(56) References Cited

U.S. PATENT DOCUMENTS

| | | |
|---|---|---|
| 6,087,251 A | 7/2000 | Hsu |
| 6,118,180 A * | 9/2000 | Loo .............. H01L 24/02 228/180.22 |
| 6,348,398 B1 | 2/2002 | Wang |
| 6,352,916 B1 | 3/2002 | Tang et al. |
| 6,358,831 B1 * | 3/2002 | Liu .............. H01L 23/3171 216/18 |
| 6,388,322 B1 | 5/2002 | Goossen et al. |
| 6,465,886 B1 | 10/2002 | Horiuchi et al. |
| 6,627,824 B1 | 9/2003 | Lin |
| 6,797,615 B1 | 9/2004 | Lous et al. |
| 6,951,773 B2 | 10/2005 | Ho et al. |
| 7,112,524 B2 | 9/2006 | Hsu et al. |
| 8,127,979 B1 * | 3/2012 | Wu .............. C23C 18/1653 205/125 |
| 8,198,140 B2 | 6/2012 | Murai et al. |
| 8,138,537 B2 | 11/2012 | Pendse |
| 8,318,537 B2 | 11/2012 | Pendse |
| 8,772,951 B1 * | 7/2014 | Kim .............. H01L 23/498 257/774 |
| 8,952,538 B2 | 2/2015 | Matsuki |
| 9,418,928 B2 * | 8/2016 | Liang ............ H05K 3/4007 |
| 9,775,230 B2 * | 9/2017 | Kim ............ H05K 1/0219 |
| 9,799,621 B2 * | 10/2017 | Lee ............ H01L 23/498 |
| 10,049,954 B2 * | 8/2018 | Bang .......... H01L 23/3128 |
| 2002/0048944 A1 | 4/2002 | Tang et al. |
| 2002/0187585 A1 | 12/2002 | Tsukada et al. |
| 2007/0080416 A1 * | 4/2007 | Yoshioka ........ G02F 1/13452 257/433 |
| 2009/0020323 A1 | 1/2009 | Chen et al. |
| 2009/0121349 A1 | 5/2009 | Suzuki |
| 2011/0079922 A1 * | 4/2011 | Yu .............. H01L 23/522 257/776 |
| 2011/0101526 A1 | 5/2011 | Hsiao et al. |
| 2011/0133334 A1 | 6/2011 | Pendse |
| 2011/0155438 A1 | 6/2011 | Ito et al. |
| 2011/0198114 A1 | 8/2011 | Maeda et al. |
| 2011/0217842 A1 | 9/2011 | Park et al. |
| 2012/0098120 A1 | 4/2012 | Yu et al. |
| 2012/0175774 A1 | 7/2012 | West et al. |
| 2012/0326299 A1 * | 12/2012 | Topacio .......... H01L 23/3171 257/737 |
| 2013/0328189 A1 | 12/2013 | Pendse |
| 2014/0035095 A1 | 2/2014 | Lin et al. |
| 2014/0151867 A1 * | 6/2014 | Lin .............. H01L 28/00 257/676 |
| 2015/0194405 A1 * | 7/2015 | Liang ............ H05K 3/4007 257/737 |
| 2015/0351228 A1 * | 12/2015 | Park ............ H01L 21/6835 361/761 |
| 2016/0093546 A1 * | 3/2016 | Pai ............ H01L 23/13 438/126 |

FOREIGN PATENT DOCUMENTS

| | | |
|---|---|---|
| CN | 102164451 A | 8/2011 |
| TW | I221644 B | 10/2004 |
| TW | 200625559 | 7/2006 |
| TW | 201115700 A | 5/2011 |
| TW | 201208024 | 2/2012 |
| TW | 201220989 A | 5/2012 |
| TW | 201246466 | 11/2012 |
| TW | 201304026 A | 1/2013 |
| TW | M462949 U | 10/2013 |

* cited by examiner

PROTRUSION BUMP PADS FOR BOND-ON-TRACE PROCESSING

PRIORITY CLAIM

This application claims the benefit to and is a divisional of U.S. patent application Ser. No. 14/148,482, filed on Jan. 6, 2014, and entitled "Protrusion Bump Pads for Bond-on-Trace Processing" which application is incorporated herein by reference.

BACKGROUND

In Bond-on-Trace (BoT) processing, a singulated, integrated circuit (IC) chip is flipped and connected to bond pad portions of traces formed on another substrate. A subset of the traces, also known as skip lines, includes traces extending between the bond pad portions, such as for fan-out purposes. Thus, the trace pitch is less than the bond pad pitch. However, this resulted in solder bonds inadvertently bridging connections with adjacent traces, and made probe testing overly challenging as the trace pitch fell below the diameter of common testing probes.

SUMMARY OF THE INVENTION

The present disclosure introduces a method comprising separating a substrate from a carrier on which an additional substrate is formed. The separated substrate comprises a conductive layer on a top surface of the substrate and a plurality of conductive pillars each extending from a bottom surface of the substrate and through the substrate to the conductive layer. A protrusion bump pad is formed over each of a first subset of the conductive pillars by selectively removing the conductive layer except from over each of the first subset of conductive pillars.

The present disclosure also introduces an apparatus comprising a substrate and a plurality of conductive traces on a first side of the substrate. Conductive pillars extend through the substrate from a second side of the substrate to corresponding ones of the conductive traces. Bump pads protrude from a first subset of the conductive traces, whereas each of a second subset of the conductive traces is recessed within the first side of the substrate.

The present disclosure also introduces a method comprising providing a die and a substrate, wherein the die comprises at least one integrated circuit chip, and the substrate comprises first and second subsets of conductive pillars extending therethrough. Each of the first subset of conductive pillars comprises a protrusion bump pad protruding from a surface of the substrate, and the second subset of conductive pillars each partially form a trace recessed within the surface of the substrate. The die is then coupled to the substrate via a plurality of conductive bumps each extending between one of the protrusion bump pads and the die.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
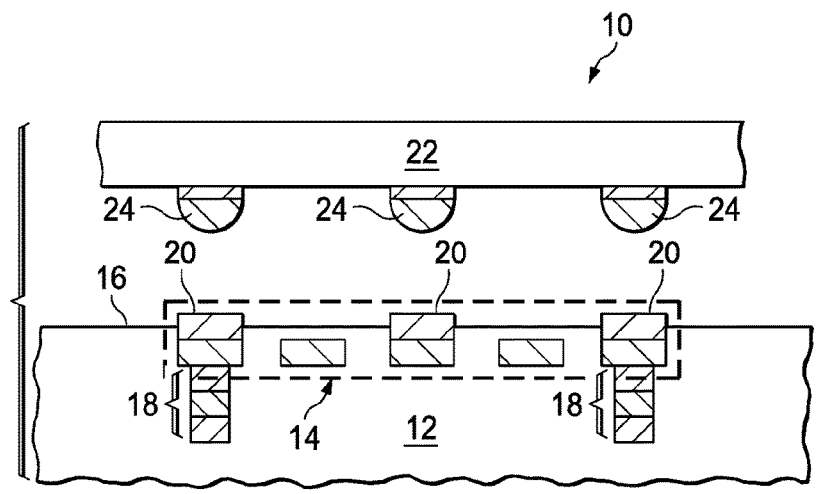
FIG. 1 is a sectional view of at least a portion of apparatus according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a sectional view of at least a portion of an apparatus 10 in an intermediate stage of manufacture according to one or more aspects of the present disclosure. The apparatus 10 comprises a substrate 12 and a plurality of conductive traces 14 disposed on a side 16 of the substrate. Conductive members 18 may extend into the substrate 12 from corresponding ones of the conductive traces 14. Bump pads 20 each protrude from one of a first subset of the conductive traces 14. Each of a second subset of the conductive traces 14 is recessed within the side 16 of the substrate 12. The apparatus 10 may further comprise an integrated circuit chip 22 and a plurality of conductive bumps 24 coupled between the integrated circuit chip and corresponding ones of the bump pads 20.

Figure 2:
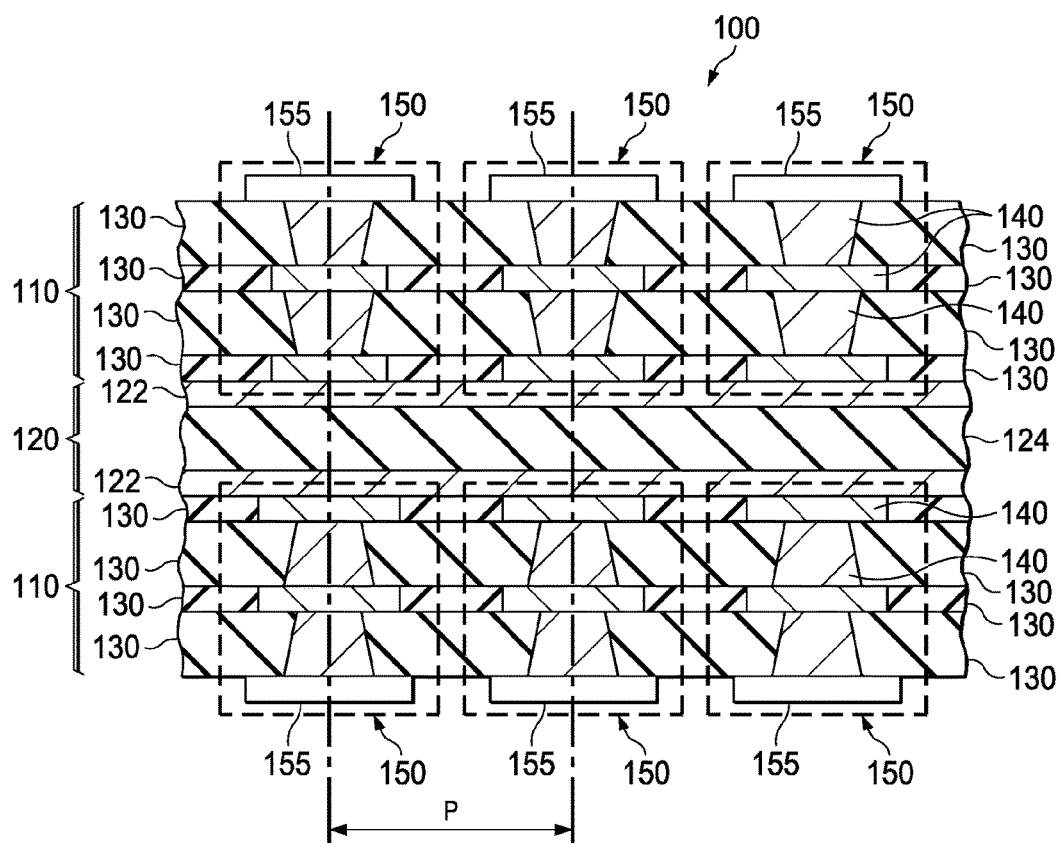
FIG. 2 is a sectional view of at least a portion of apparatus in an intermediate stage of manufacture according to one or more aspects of the present disclosure.

FIG. 2 is a sectional view of an implementation of the apparatus 10 shown in FIG. 1, herein designated by the reference numeral 100. The apparatus 100 is depicted in FIG. 2 as being in an intermediate stage of manufacture according to one or more aspects of the present disclosure. The apparatus 100 comprises build-up layers 110 on opposing sides of a carrier substrate 120. The carrier substrate 120 may comprise a coreless substrate, such as may comprise one or more metal layers 122 formed on one or both sides of an insulation layer 124. The insulation layer 124 and/or the carrier substrate 120 may comprise a single-sided or double-sided copper clad laminate (CCL), a prepreg or ajinomoto build-up film (ABF), paper, glass fiber, non-woven glass fabric, one or more layers of copper, nickel, aluminum, and/or other materials, elements, and/or compositions. The one or more metal layers 122 may comprise one or more layers of copper, nickel, aluminum, and/or other materials.

Among other components, the build-up layers 110 may comprise multiple dielectric layers 130 and metallization layers 140. Portions of the metallization layers 140 are vertically aligned to form conductive pillars 150.

The dielectric layers 130 may comprise a prepreg or ajinomoto build-up film (ABF). Alternatively, or additionally, the dielectric layers 130 may comprise paper, glass fiber, and/non-woven glass fabric, one or more of which may be applied by lamination. Alternatively, or additionally, the dielectric layers 130 may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. The dielectric layers 130 may be formed by sputtering, spin-on coating, chemical vapor deposition (CVD), low-pressure CVD, rapid thermal CVD, atomic layer CVD, and/or plasma enhanced CVD, perhaps utilizing tetraethyl orthosilicate and oxygen as a precursor. The dielectric layers 130 may also be formed by an oxidation process, such as wet or dry thermal oxidation in an ambient environment comprising an oxide, water, nitric oxide, or a combination thereof, and/or other processes. Fabrication of the dielectric layers 130 may also comprise chemical-mechanical polishing or planarizing (hereafter collectively referred to as CMP), isotropic etching, and/or anisotropic etching, among other processes. The dielectric layers 130 may be formed to a thickness ranging between about eight angstroms and about 200 angstroms, although other thicknesses are also within the scope of the present disclosure.

The metallization layers 140 may comprise one or more of copper, titanium, aluminum, nickel, gold, alloys and/or combinations thereof, and/or other materials. The metallization layers 140 may be formed by plating, perhaps to a thickness ranging between about four microns and about 25 microns. Alternatively, or additionally, the metallization layers 140 may be formed by CVD and/or other processes, and may have a thickness ranging between about eight angstroms and about 200 angstroms, although other thicknesses are also within the scope of the present disclosure.

The conductive pillars 150 and/or bond pads 155 thereof may have diameter and/or other lateral dimension ranging between about 150 microns and about 400 microns. The bond pads 155 may each be a BGA (ball grid array) pad, such as may be subsequently utilized in forming an interconnection with a "mother board" PCB (printed circuit board) and/or another PCB, PWB (printed wiring board), PCA (printed circuit assembly), PCBA (PCB assembly), CCA (circuit card assembly), backplane assembly, and/or apparatus. A pillar pitch P, or the lateral offset between neighboring conductive pillars 150 and/or bond pads 155, may range between about 300 microns and about 500 microns.

Figure 3:
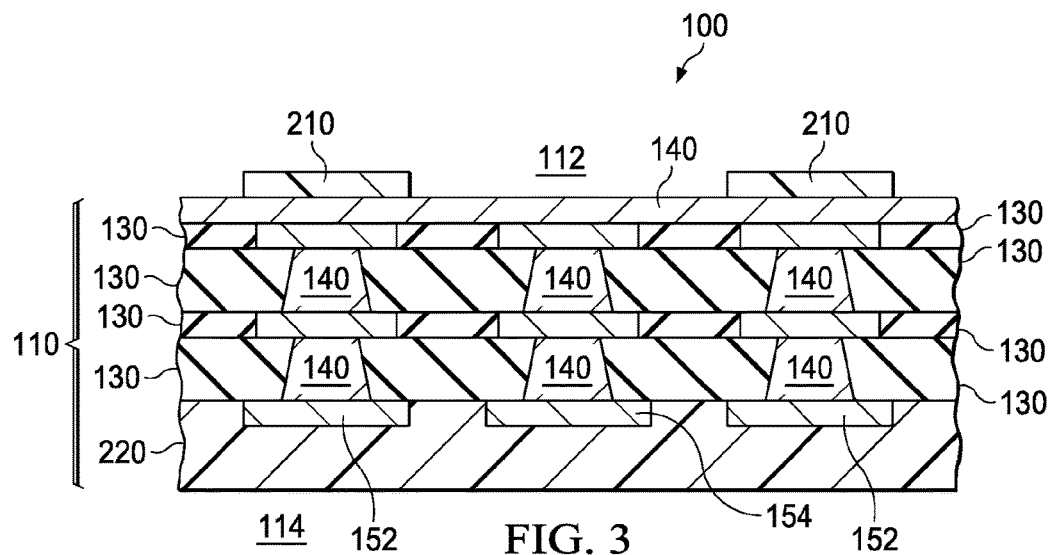
FIG. 3 is a sectional view of the apparatus shown in FIG. 2 in a subsequent stage of manufacture according to one or more aspects of the present disclosure.

FIG. 3 is a sectional view of the apparatus 100 shown in FIG. 2 in a subsequent stage of manufacture according to one or more aspects of the present disclosure, in which the sections of build-up layers 110 have been removed from the carrier substrate 120. One of the sections of build-up layers 110 is not shown in FIG. 3, although this is merely for the sake of simplifying the following discussion, and a person having ordinary skill in the art will readily recognize that both sections of the build-up layers 110 may be processed according to one or more of the aspects of the present disclosure. The build-up layers 110 may be removed from the carrier substrate 120 by routing, melting, mechanical force, etching and/or other processes.

A photoresist layer may then be coated, exposed, and developed on one or both sides of the build-up layers 110. For example, photoresist portions 210 may be formed on a first side 112 of the build-up layers 110, and a photoresist layer 220 may substantially cover a second side 114 of the build-up layers 110. The conductive pillars 150 may be divided between a first subset and a second subset. In FIG. 3, the first subset comprises conductive pillars 152, and the second subset comprises conductive pillar 154. The first subset will comprise more than the two conductive pillars 152 depicted in FIG. 3, and the second subset will comprise more than the one conductive pillar 154 depicted in FIG. 3.

The photoresist portions 210 on the first side 112 of the build-up layers 110 are formed over each conductive pillar 152 of the first subset, whereas the conductive pillars 154 of the second subset and the remaining surface features on the first side 112 of the build-up layers 110 may remain exposed to the subsequent lithographic processing. The photoresist portions 210 and layer 220 may comprise a chemically amplified photoresist or a non-chemically amplified photoresists, and may be positive-tone or negative tone. Processing of the photoresist portions 210 and layer 220 may comprise a deposition process including, for example, lamination of a dry film type photoresist, spin-on-coating, dip coating, brush coating, and/or ink-jet dispensing, among others. A post deposition baking step may be performed to remove solvent and/or other unwanted components, such as to a temperature ranging between about 40° C. and about 200° C., perhaps for a baking time ranging between about 10 seconds and about 10 minutes.

Figure 4:
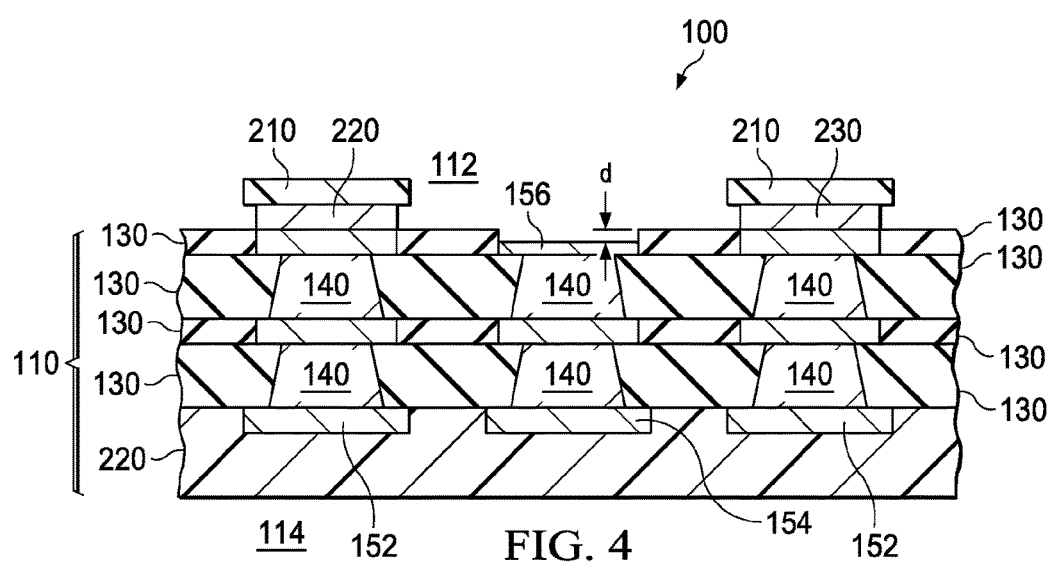
FIG. 4 is a sectional view of the apparatus shown in FIG. 3 in a subsequent stage of manufacture according to one or more aspects of the present disclosure.

FIG. 4 is a sectional view of the apparatus 100 shown in FIG. 3 in a subsequent stage of manufacture according to one or more aspects of the present disclosure, in which the photoresist portions 210 over the conductive pillars 152 of the first subset have been utilized as a mask during an etching process. The etching process is utilized to remove the portions of the outermost metallization layers 140 that are not protected by the photoresist portions 210 and layer 220. Thus, on the first side 112 of the build-up layers 110, the outermost metallization layer 140 is removed down to the outermost dielectric layer 130. However, the etching of the outermost metallization layer 140 over the conductive pillars 154 of the second subset is continued for a sufficient time so as to recess the exposed surface 156 of the conductive pillars 154 within the outer surface of the outermost dielectric layer 130. The exposed surface 156 of the second subset of conductive pillars 154 thus forms a portion of a recessed trace, whereas the masked portion of each of the first subset of conductive pillars 152 forms a protrusion bump pad 230. The depth d of the recess over the recessed trace, below the surface of the surrounding dielectric layer 130, may be less than about seven microns, such as about four microns, although other depths are also within the scope of the present disclosure.

Figure 5:
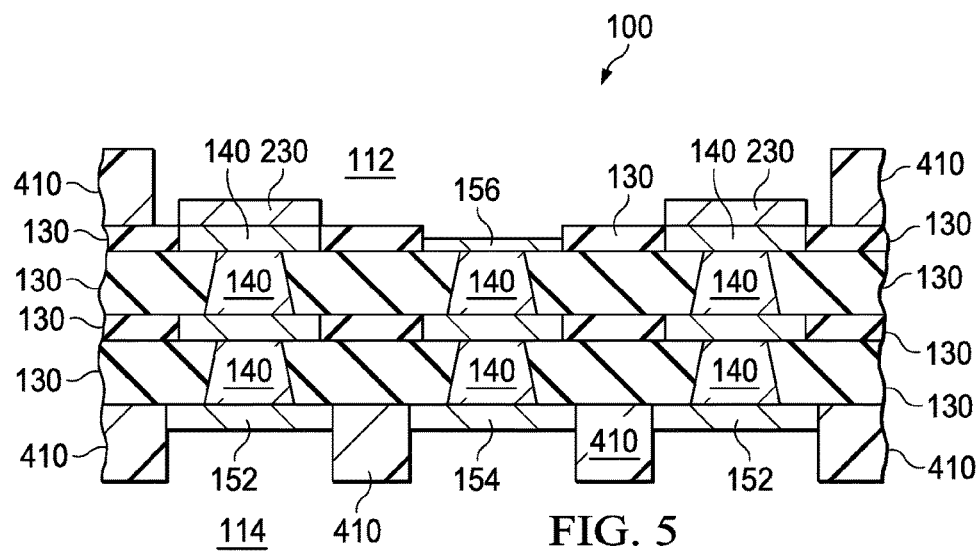
FIG. 5 is a sectional view of the apparatus shown in FIG. 4 in a subsequent stage of manufacture according to one or more aspects of the present disclosure.

FIG. 5 is a sectional view of the apparatus 100 shown in FIG. 4 in a subsequent stage of manufacture according to one or more aspects of the present disclosure, in which the photo resist portions 210 and the photoresist layer 220 have been removed, and solder resist portions 410 have been formed by conventional means. The solder resist portions 410 may comprise a heat-resistant coating material, and may aid in protecting the underlying layers.

Figure 6:
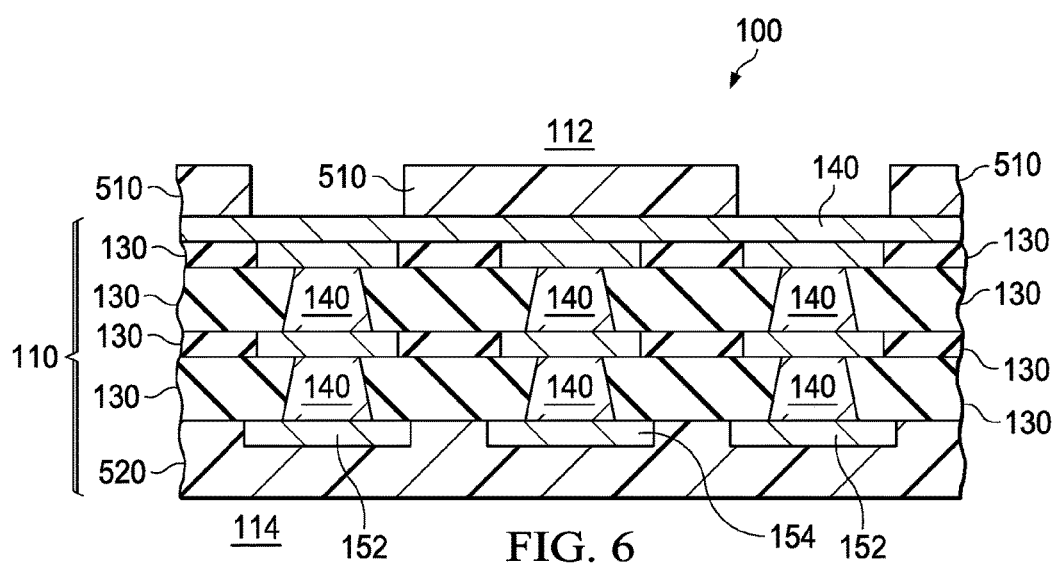
FIG. 6 is a sectional view of the apparatus shown in FIG. 2 in a subsequent stage of manufacture according to one or more aspects of the present disclosure.
Figure 7:
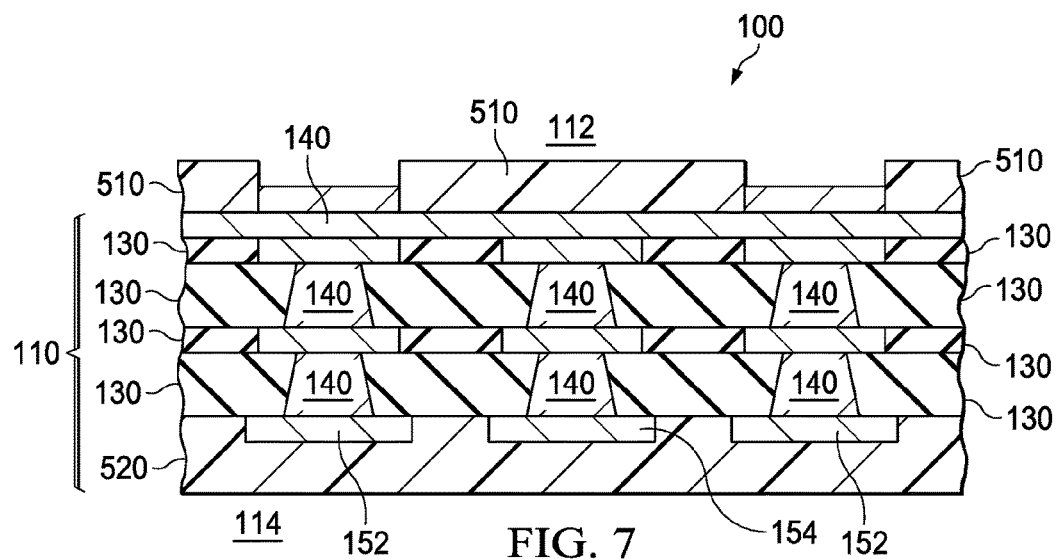
FIG. 7 is a sectional view of the apparatus shown in FIG. 6 in a subsequent stage of manufacture according to one or more aspects of the present disclosure.
Figure 8:
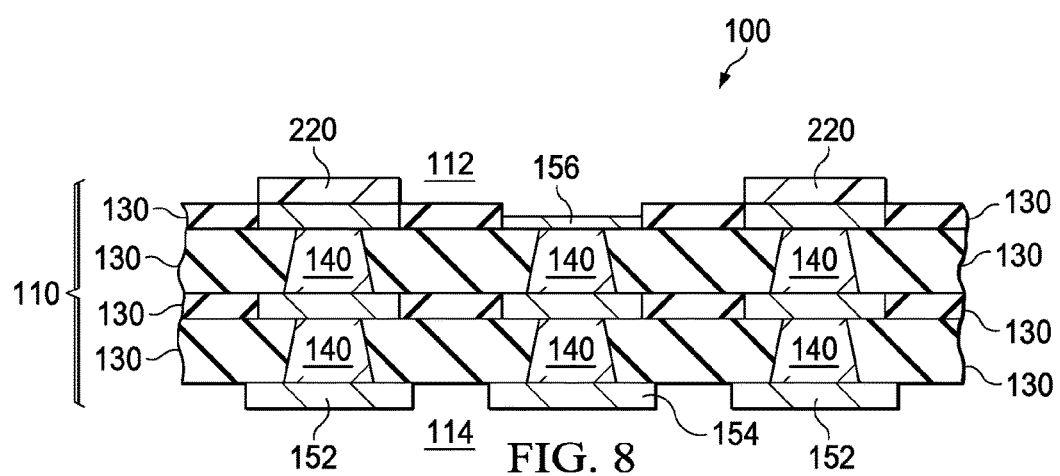
FIG. 8 is a sectional view of the apparatus shown in FIG. 7 in a subsequent stage of manufacture according to one or more aspects of the present disclosure.

Other methods of forming the protrusion bump pads 230 and recessed traces 156 are also within the scope of the present disclosure. One such example is depicted in FIGS. 6-8. FIG. 6 is a sectional view of the apparatus 100 shown in FIG. 2 in a subsequent stage of manufacture according to one or more aspects of the present disclosure. As above, the build-up layers 110 have been removed from the carrier substrate 120. A photoresist layer may then be coated, exposed, and developed on one or both sides of the build-up layers 110. For example, photoresist portions 510 may be formed on the first side 112 of the build-up layers 110, and a photoresist layer 520 may substantially cover the second side 114 of the build-up layers 110. The photoresist portions 510 on the first side 112 of the build-up layers 110 may substantially cover the entire first side 112, including over each conductive pillar 154 of the second subset, except for over the conductive pillars 152 of the first subset, which remain exposed for subsequent processing.

FIG. 7 is a sectional view of the apparatus 100 shown in FIG. 6 in a subsequent stage of manufacture according to one or more aspects of the present disclosure, in which the photoresist portions 510 have been utilized as a mask during a metallization process. The metallization process is utilized to add metal to the exposed conductive pillars 152 of the first subset. The material added by the metallization process may comprise one or more of copper, titanium, aluminum, nickel, gold, alloys and/or combinations thereof, and/or other materials. The metallization may be formed by electroplating, electroless plating, CVD, epitaxial growth, and/or other processes, and may add material to the conductive pillars 152 to a thickness ranging between about five microns and about 50 microns, although other thicknesses are also within the scope of the present.

FIG. 8 is a sectional view of the apparatus 100 shown in FIG. 7 in a subsequent stage of manufacture according to one or more aspects of the present disclosure, in which the photoresist portions 510 and the photoresist layer 520 have been removed. FIG. 8 also reflects the result of an etching process selective to the conductive pillars 152 of the first subset, the conductive pillars 154 of the second subset, and the outermost metallization layer 140. For example, the outermost metallization layer 140 is removed down to the outermost dielectric layer 130, including to a degree sufficient to recess the exposed surface 156 of the second subset of conductive pillars 154 within the outer surface of the outermost dielectric layer 130. As above, the exposed surface 156 of the second subset of conductive pillars 154 forms a portion of a recessed trace, whereas the now protruding portion of each of the first subset of conductive pillars 152 forms a protrusion bump pad 230. The tops of the conductive pillars (the protruding pillars) are also etched back during this process. Therefore, the process step of adding metallization, illustrated in FIG. 7, should be adjusted to ensure that sufficient height of the protruding pillars remains, even after this subsequent etch step. Additional processing may ensue, such as to form solder resist portions and/or otherwise arrive at the embodiment depicted in FIG. 5.

Figure 9:
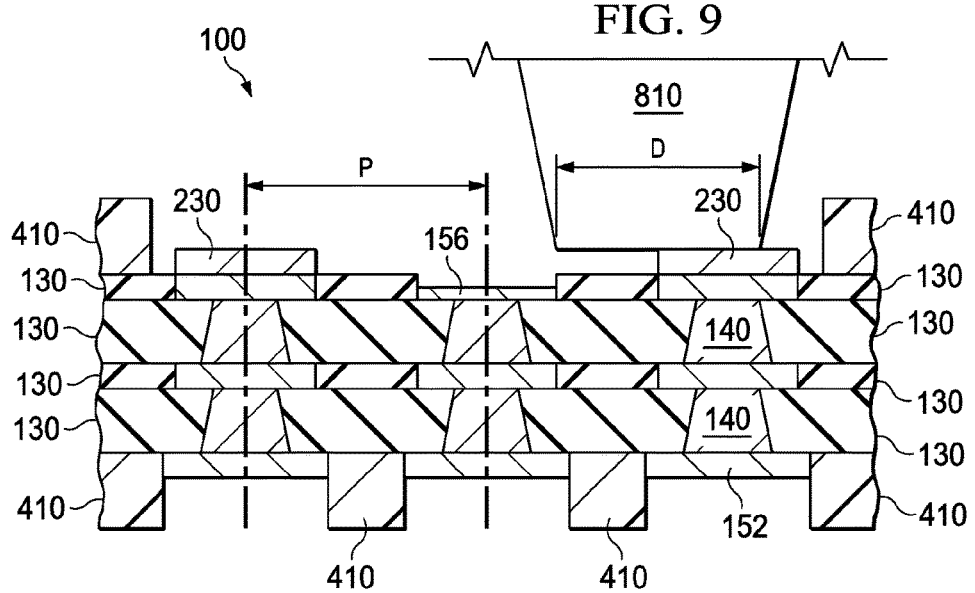
FIG. 9 is a sectional view of the apparatus shown in FIG. 5 in a subsequent stage of manufacture according to one or more aspects of the present disclosure.

FIG. 9 is a sectional view of the apparatus 100 shown in FIG. 5 in which a testing probe 810 has been brought into contact with one of the protrusion bump pads 230 of a conductive pillar 152 of the first subset. The tip of the testing probe 810 may have a diameter D, which may be substantially greater than the pillar pitch P. For example, the pillar pitch P may be about 40 microns, if not smaller, and the testing probe 810 may have a tip diameter D of about 30 microns, if not significantly larger. However, because the conductive pillars 154 of the second subset are recessed, they are not shorted by misalignment of the testing probe 810 relative to the conductive pillars 152 of the first subset.

Figure 10:
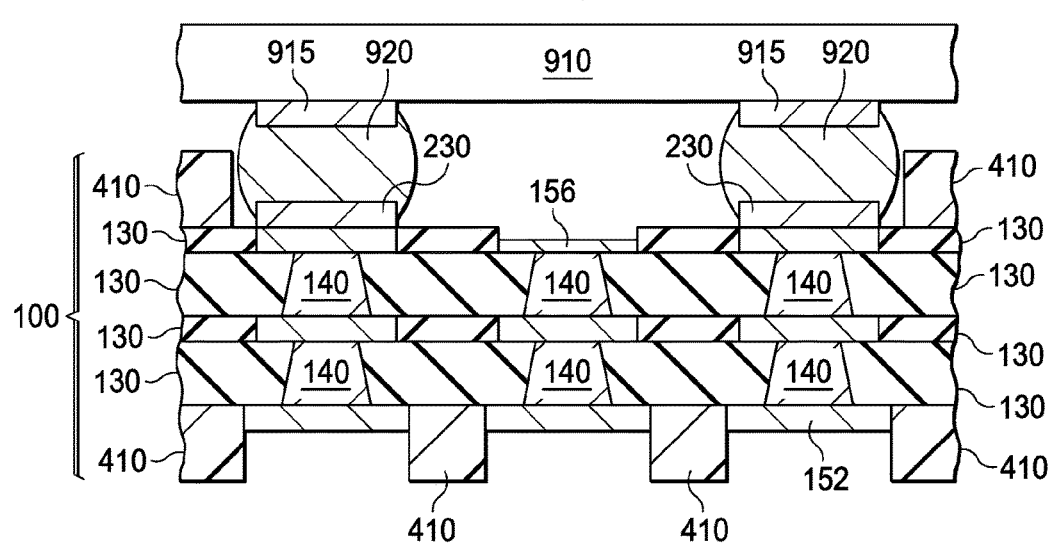
FIG. 10 is a sectional view of the apparatus shown in FIG. 5 in a subsequent stage of manufacture according to one or more aspects of the present disclosure.

FIG. 10 is a sectional view of at least a portion of an apparatus 900 according to one or more aspects of the present disclosure. The apparatus 900 includes the apparatus 100 shown in FIG. 5, a die 910, and a plurality of conductive bumps 920 coupled between the integrated circuit chip and corresponding ones of the bump pads. The die 910 may be or comprise one or more integrated circuit chips, packages, and the like. The conductive bumps 920 may comprise solder, gold, conductive paste, and/or other electrically conductive materials. The die 910 may comprise pads 915 configured to be aligned with the protrusion bump pads 230 prior to be coupled by the conductive bumps 920.

In at least one aspect, embodiments described herein may provide for an apparatus including a substrate and a plurality of conductive traces disposed on a side of the substrate. The apparatus further includes a plurality of conductive members each extending into the substrate from a corresponding one of the conductive traces, and a plurality of bump pads each protruding from one of a first subset of the conductive traces, wherein a second subset of the conductive traces are recessed within the side of the substrate.

In at least another aspect, embodiments described herein may provide for an apparatus including a build-up layer having a topmost surface and a bottommost surface, and a first conductive trace formed at the topmost surface. The apparatus may further include a bump pad protruding from the first conductive trace and extending above the topmost surface, and a second conductive trace at the topmost surface, the second conductive trace having a second topmost surface that is recessed relative the topmost surface of the build-up layer. The apparatus may further include a conductive pillar extending from the first conductive trace to the bottommost surface of the build-up layer.

In yet another aspect, embodiments described herein may provide for an apparatus comprising a plurality of conductive traces disposed on a first side of a build-up layer, and a plurality of bump pads. Respective bump pads protrude from respective ones of a first subset of the conductive traces, and respective ones of a second subset of the conductive traces are recessed within the first side of the build-up layer.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same purposes and/or achieving the same advantages of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. § 1.72(b) to allow the reader to quickly ascertain the nature of the technical disclosure. It is submitted with the understanding that it will not be used to interpret or limit the scope or meaning of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus, comprising:
a substrate;
conductive traces at a first side of the substrate;
conductive members extending into the substrate from corresponding conductive traces; and
bump pads protruding from a first subset of the conductive traces;
an integrated circuit chip over the substrate; and
conductive bumps coupled between the integrated circuit chip and the bump pads, wherein the conductive bumps cover upper surfaces of the bump pads and cover at least upper sidewalls of the bump pads, wherein lower surfaces of the bump pads are level with an upper surface of a topmost dielectric layer of the substrate, wherein the lower surfaces of the bump pads physically contact respective upper surfaces of the first subset of the conductive traces, wherein the bump pads and the first subset of the conductive traces have a same width, wherein the upper surfaces of the first subset of the conductive traces are level with the upper surface of the topmost dielectric layer, wherein upper surfaces of a second subset of the conductive traces are recessed from the upper surface of the top dielectric layer of the substrate, wherein lower surfaces of the second subset of the conductive traces and lower surfaces of the first subset of the conductive traces are level with a lower surface of the topmost dielectric layer.

2. The apparatus of claim 1, wherein the conductive members are conductive pillars extending to corresponding conductive features disposed on a second side of the substrate opposing the first side.

3. The apparatus of claim 1, wherein the conductive traces are laterally offset from one another by a minimum trace pitch, the bump pads are laterally offset from one another by a minimum bump pad pitch, and the minimum bump pad pitch is substantially greater than the minimum trace pitch.

4. The apparatus of claim 1, wherein the conductive traces are laterally offset from one another by a minimum trace pitch, the bump pads are laterally offset from one another by a minimum bump pad pitch, and the minimum bump pad pitch is at least about twice the minimum trace pitch.

5. The apparatus of claim 1, wherein the conductive bumps are laterally offset from one another by a minimum bump pitch of less than about no microns.

6. The apparatus of claim 1, wherein the substrate comprises a stack of insulating layers having respective embedded conductive elements embedded therein.

7. An apparatus comprising:
a build-up layer having a first topmost surface and a first bottommost surface, the first topmost surface being an upper surface of a topmost dielectric layer of the build-up layer;
a first conductive trace in the topmost dielectric layer, an upper surface of the first conductive trace being level with the first topmost surface, a lower surface of the first conductive trace being level with a lower surface of the topmost dielectric layer, the first conductive trace having a first uniform width;
a first bump pad contacting and protruding from the first conductive trace, the first bump pad extending above the first topmost surface, the first bump pad having a second uniform width that is the same as the first uniform width;
a second conductive trace in the topmost dielectric layer, the second conductive trace having a second topmost surface and a second bottommost surface, wherein the second topmost surface is recessed from the first topmost surface of the build-up layer and is closer to the first topmost surface of the build-up layer than the second bottommost surface, wherein the second bottommost surface is level with the lower surface of the topmost dielectric layer; and
a conductive pillar extending from the first conductive trace to the first bottommost surface of the build-up layer.

8. The apparatus of claim 7, further comprising:
a third conductive trace formed at the first topmost surface;
a second bump pad protruding from the third conductive trace and extending above the first topmost surface; and
wherein the second conductive trace extends parallel to the first topmost surface of the build-up layer and extends between the first bump pad and the second bump pad.

9. The apparatus of claim 8, wherein the first bump pad and the second bump pad are laterally offset from one another by a pitch of less than about no microns.

10. The apparatus of claim 8, further comprising:
an integrated circuit die having a first contact pad bonded to the first bump pad and having a second contact pad bonded to the second bump pad.

11. The apparatus of claim 10, further comprising a first solder bump bonding the first contact pad to the first bump pad and a second solder bump bonding the second contact pad to the second bump pad.

12. The apparatus of claim 7, wherein the build-up layer comprises multiple dielectric layers and metallization formed within the dielectric layers.

13. The apparatus of claim 12, wherein the dielectric layers comprise a material selected from the group consisting of prepreg, ajinomoto build-up film, paper, glass fiber, and non-woven glass fabric.

14. The apparatus of claim 12, wherein the dielectric layers comprise a material selected from the group consisting of silicon dioxide, silicon nitride, silicon oxynitride, an oxide, a nitrogen containing oxide, aluminum oxide, lanthanum oxide, hafnium oxide, zirconium oxide, hafnium oxynitride, and combinations thereof.

15. An apparatus comprising:
conductive traces disposed in a topmost dielectric layer of a build-up layer; and
bump pads, respective bump pads protruding from respective ones of a first subset of the conductive traces, wherein the first subset of the conductive traces have a bottommost surface that is level with a lower surface of the topmost dielectric layer and a topmost surface that is level with an upper surface of the topmost dielectric layer, wherein a second subset of the conductive traces have a bottommost surface that is level with the bottommost surface of the first subset of the conductive traces and a topmost surface that is recessed within the topmost dielectric layer of the build-up layer, wherein the bump pads and the first subset of the conductive traces have a same width such that sidewalls of the bump pads and respective sidewalls of the first subset of the conductive traces are aligned.

16. The apparatus of claim 15, further comprising a plurality of conductive pillars extending from at least one of the conductive traces through the build-up layer from a first side of the build-up layer to a second side of the build-up layer opposing the first side.

17. The apparatus of claim 15, wherein the conductive traces are laterally offset from one another by a minimum trace pitch, the bump pads are laterally offset from one another by a minimum bump pad pitch, and the minimum bump pad pitch is greater than the minimum trace pitch.

18. The apparatus of claim 15, wherein the conductive traces are laterally offset from one another by a minimum trace pitch, the bump pads are laterally offset from one another by a minimum bump pad pitch, and the minimum bump pad pitch is at least twice the minimum trace pitch.

19. The apparatus of claim 1, wherein each of the first subset of the conductive traces is laterally spaced from an adjacent conductive trace of the second subset of the conductive traces by a first distance, wherein the first distance is between about 300 microns and about 500 microns.

20. The apparatus of claim 1, wherein the conductive bumps comprise solder.

\* \* \* \* \*

UNITED STATES PATENT AND TRADEMARK OFFICE
CERTIFICATE OF CORRECTION

PATENT NO. : 10,163,774 B2  
APPLICATION NO. : 15/003632  
DATED : December 25, 2018  
INVENTOR(S) : Yu-Min Liang Page 1 of 1

It is certified that error appears in the above-identified patent and that said Letters Patent is hereby corrected as shown below:

In the Claims

In Column 7, Line 59, Claim 5, delete "less than about no microns" and insert --less than about 110 microns--.

In Column 8, Line 35, Claim 9, delete "less than about no microns" and insert --less than about 110 microns--.

In Column 8, Lines 60-61, Claim 15, delete "bump pads, respective bump pads protruding from respective ones" and insert --bump pads protruding from respective ones--.

Signed and Sealed this  
Ninth Day of April, 2019

Andrei Iancu  
*Director of the United States Patent and Trademark Office*